(12) United States Patent
Kang et al.

(10) Patent No.: US 9,716,075 B2
(45) Date of Patent: Jul. 25, 2017

(54) SEMICONDUCTOR CHIP ASSEMBLY AND METHOD FOR MAKING SAME

(71) Applicant: Tessera, Inc., San Jose, CA (US)

(72) Inventors: Teck-Gyu Kang, San Jose, CA (US); Wei-Shun Wang, Palo Alto, CA (US); Hiroaki Sato, Yokohama (JP); Kiyoaki Hashimoto, Kanagawa (JP); Yoshikuni Nakadaira, Yokohama (JP); Norihito Masuda, Yokohama (JP); Belgacem Haba, Saratoga, CA (US); Ilyas Mohammed, San Jose, CA (US); Philip Damberg, Cupertino, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 14/851,925

(22) Filed: Sep. 11, 2015

(65) Prior Publication Data
US 2016/0005711 A1    Jan. 7, 2016

Related U.S. Application Data

(62) Division of application No. 13/157,722, filed on Jun. 10, 2011, now Pat. No. 9,137,903.
(Continued)

(51) Int. Cl.
*B23K 31/02* (2006.01)
*H01L 23/00* (2006.01)
(Continued)

(52) U.S. Cl.
CPC ............ *H01L 24/81* (2013.01); *B23K 1/0016* (2013.01); *H01L 21/486* (2013.01);
(Continued)

(58) Field of Classification Search
CPC ............ B23K 1/0016; B23K 2201/36–2201/42
(Continued)

(56) References Cited

U.S. PATENT DOCUMENTS 3,465,435 A    9/1969 Steranko
3,801,388 A    4/1974 Akiyama et al.
(Continued)

FOREIGN PATENT DOCUMENTS

EP    0615283 A1    9/1994
JP    57-79652    5/1982
(Continued)

OTHER PUBLICATIONS

U.S. Appl. No. 12/842,612, filed Jul. 23, 2010.
(Continued)

*Primary Examiner* — Kiley Stoner
(74) *Attorney, Agent, or Firm* — Lerner, David, Littenberg, Krumholz & Mentlik, LLP

(57) ABSTRACT

A microelectronic assembly may include a substrate including a rigid dielectric layer having electrically conductive elements, a microelectronic element having a plurality of contacts exposed at a face thereof, and conductive vias extending through a compliant dielectric layer overlying the rigid dielectric layer. The vias electrically connect the substrate contacts respectively to the conductive elements, and the substrate contacts are joined respectively to the contacts of the microelectronic element. The vias, compliant layer and substrate contacts are adapted to appreciably relieve stress at the substrate contacts associated with differential thermal contact and expansion of the assembly.

11 Claims, 12 Drawing Sheets

Related U.S. Application Data

(60) Provisional application No. 61/425,432, filed on Dec. 21, 2010.

(51) Int. Cl.

| | | |
|---|---|---|
| *B23K 1/00* | (2006.01) | |
| *H05K 1/11* | (2006.01) | |
| *H05K 3/40* | (2006.01) | |
| *H01L 23/498* | (2006.01) | |
| *H01L 21/56* | (2006.01) | |
| *H01L 21/48* | (2006.01) | |
| *H05K 3/34* | (2006.01) | |
| *H01L 23/31* | (2006.01) | |

(52) U.S. Cl.
CPC ........ *H01L 21/4857* (2013.01); *H01L 21/563* (2013.01); *H01L 23/49811* (2013.01); *H01L 23/562* (2013.01); *H05K 1/113* (2013.01); *H05K 3/341* (2013.01); *H05K 3/4007* (2013.01); *H01L 23/3128* (2013.01); *H01L 23/49822* (2013.01); *H01L 24/13* (2013.01); *H01L 24/16* (2013.01); *H01L 24/73* (2013.01); *H01L 2224/131* (2013.01); *H01L 2224/133* (2013.01); *H01L 2224/13016* (2013.01); *H01L 2224/13017* (2013.01); *H01L 2224/13023* (2013.01); *H01L 2224/13111* (2013.01); *H01L 2224/13147* (2013.01); *H01L 2224/16225* (2013.01); *H01L 2224/16227* (2013.01); *H01L 2224/16238* (2013.01); *H01L 2224/32225* (2013.01); *H01L 2224/73204* (2013.01); *H01L 2224/8138* (2013.01); *H01L 2224/8185* (2013.01); *H01L 2224/81192* (2013.01); *H01L 2224/81193* (2013.01); *H01L 2224/81801* (2013.01); *H01L 2224/831* (2013.01); *H01L 2924/014* (2013.01); *H01L 2924/0105* (2013.01); *H01L 2924/01049* (2013.01); *H01L 2924/09701* (2013.01); *H01L 2924/14* (2013.01); *H01L 2924/351* (2013.01); *H05K 2201/0195* (2013.01); *Y10T 29/4913* (2015.01); *Y10T 29/49126* (2015.01)

(58) Field of Classification Search
USPC .................. 228/179.1–180.22; 438/125, 126
See application file for complete search history.

(56) References Cited

U.S. PATENT DOCUMENTS

| | | |
|---|---|---|
| 4,021,838 A | 5/1977 | Warwick |
| 4,067,104 A | 1/1978 | Tracy |
| 4,251,852 A | 2/1981 | Ecker et al. |
| 4,258,382 A | 3/1981 | Harris |
| 4,280,458 A | 7/1981 | Kiovsky |
| 4,466,184 A | 8/1984 | Cuneo et al. |
| 4,579,022 A | 4/1986 | Kasai et al. |
| 4,642,889 A | 2/1987 | Grabbe |
| 4,666,735 A | 5/1987 | Hoover et al. |
| 4,695,870 A | 9/1987 | Patraw |
| 4,716,049 A | 12/1987 | Patraw |
| 4,783,594 A | 11/1988 | Schulte et al. |
| 4,804,132 A | 2/1989 | DiFrancesco |
| 4,818,728 A | 4/1989 | Rai et al. |
| 4,825,539 A | 5/1989 | Nagashima et al. |
| 4,845,542 A | 7/1989 | Bezuk et al. |
| 4,878,990 A | 11/1989 | Dugan et al. |
| 4,942,140 A | 7/1990 | Ootsuki et al. |
| 4,955,523 A | 9/1990 | Carlommagno et al. |
| 4,961,259 A | 10/1990 | Schreiber |
| 4,969,827 A | 11/1990 | Hahs, Jr. |
| 4,975,079 A | 12/1990 | Beaman et al. |
| 4,989,069 A | 1/1991 | Hawkins |
| 5,067,007 A | 11/1991 | Otsuka et al. |
| 5,072,520 A | 12/1991 | Nelson |
| 5,083,697 A | 1/1992 | Difrancesco |
| 5,118,029 A | 6/1992 | Fuse et al. |
| 5,118,386 A | 6/1992 | Kataoka et al. |
| 5,133,495 A | 7/1992 | Angulas et al. |
| 5,148,265 A | 9/1992 | Khandros et al. |
| 5,148,266 A | 9/1992 | Khandros et al. |
| 5,160,409 A | 11/1992 | Moore et al. |
| 5,189,505 A | 2/1993 | Bartelink |
| 5,196,726 A | 3/1993 | Nishiguchi et al. |
| 5,203,075 A | 4/1993 | Angulas et al. |
| 5,213,676 A | 5/1993 | Reele et al. |
| 5,214,308 A | 5/1993 | Nishiguchi et al. |
| 5,216,278 A | 6/1993 | Lin et al. |
| 5,237,130 A | 8/1993 | Kulesza et al. |
| 5,239,746 A | 8/1993 | Goldman |
| 5,241,133 A | 8/1993 | Mullen, III et al. |
| 5,251,455 A | 10/1993 | Cur et al. |
| 5,273,938 A | 12/1993 | Lin et al. |
| 5,278,429 A | 1/1994 | Takenaka et al. |
| 5,285,352 A | 2/1994 | Pastore et al. |
| 5,296,649 A | 3/1994 | Kosuga et al. |
| 5,316,788 A | 5/1994 | Dibble et al. |
| 5,327,013 A | 7/1994 | Moore et al. |
| 5,329,423 A | 7/1994 | Scholz |
| 5,334,804 A | 8/1994 | Love et al. |
| 5,338,900 A | 8/1994 | Schneider et al. |
| 5,354,205 A | 10/1994 | Feigenbaum et al. |
| 5,361,491 A | 11/1994 | Oomachi et al. |
| 5,397,997 A | 3/1995 | Tuckerman et al. |
| 5,399,903 A | 3/1995 | Rostoker et al. |
| 5,414,298 A | 5/1995 | Grube et al. |
| 5,431,328 A | 7/1995 | Chang et al. |
| 5,455,390 A | 10/1995 | DiStefano et al. |
| 5,518,964 A | 5/1996 | DiStefano et al. |
| 5,574,311 A | 11/1996 | Matsuda |
| 5,594,275 A | 1/1997 | Kwon et al. |
| 5,640,052 A | 6/1997 | Tsukamoto |
| 5,653,891 A | 8/1997 | Otsuki et al. |
| 5,656,550 A | 8/1997 | Tsuji et al. |
| 5,659,952 A | 8/1997 | Kovac et al. |
| 5,679,977 A | 10/1997 | Khandros et al. |
| 5,725,995 A | 3/1998 | Leedy |
| 5,731,709 A | 3/1998 | Pastore et al. |
| 5,802,699 A | 9/1998 | Fjelstad et al. |
| 5,821,457 A | 10/1998 | Mosley et al. |
| 5,870,289 A | 2/1999 | Tokuda et al. |
| 5,980,663 A | 11/1999 | Badehi |
| 5,998,861 A | 12/1999 | Hiruta |
| 6,025,650 A | 2/2000 | Tsuji et al. |
| 6,077,765 A | 6/2000 | Naya |
| 6,088,236 A | 7/2000 | Tomura et al. |
| 6,103,552 A | 8/2000 | Lin |
| 6,127,724 A | 10/2000 | DiStefano |
| 6,150,709 A | 11/2000 | Shin et al. |
| 6,175,151 B1 | 1/2001 | Hashimoto |
| 6,177,636 B1 | 1/2001 | Fjelstad |
| 6,202,297 B1 | 3/2001 | Faraci et al. |
| 6,231,742 B1 | 5/2001 | Sano et al. |
| 6,255,740 B1 | 7/2001 | Tsuji et al. |
| 6,258,625 B1 | 7/2001 | Brofman et al. |
| 6,281,106 B1 | 8/2001 | Higdon et al. |
| 6,335,571 B1 | 1/2002 | Capote et al. |
| 6,340,793 B1 | 1/2002 | Yaguchi et al. |
| 6,350,705 B1 | 2/2002 | Lin |
| 6,451,626 B1 | 9/2002 | Lin et al. |
| 6,458,411 B1 | 10/2002 | Goossen et al. |
| 6,495,914 B1 | 12/2002 | Sekine et al. |
| 6,509,639 B1 | 1/2003 | Lin |
| 6,545,228 B2 | 4/2003 | Hashimoto |
| 6,550,666 B2 | 4/2003 | Chew et al. |
| 6,578,754 B1 | 6/2003 | Tung |
| 6,624,653 B1 | 9/2003 | Cram |
| 6,646,289 B1 | 11/2003 | Badehi |
| 6,696,644 B1 | 2/2004 | Chiu et al. |
| 6,703,705 B2 | 3/2004 | Yamazaki et al. |
| 6,765,287 B1 | 7/2004 | Lin |

(56) References Cited

U.S. PATENT DOCUMENTS

| | | |
|---|---|---|
| 6,774,317 B2 | 8/2004 | Fjelstad |
| 6,780,751 B2 | 8/2004 | Fay |
| 6,782,610 B1 | 8/2004 | Iijima et al. |
| 6,794,741 B1 | 9/2004 | Lin et al. |
| 6,826,827 B1 | 12/2004 | Fjelstad |
| 6,847,109 B2 | 1/2005 | Shim et al. |
| 6,927,489 B1 | 8/2005 | Yaguchi et al. |
| 6,927,491 B1 | 8/2005 | Yamada |
| 6,977,428 B2 | 12/2005 | Nakamura et al. |
| 7,034,391 B2 | 4/2006 | Pendse |
| 7,138,299 B2 | 11/2006 | Fjelstad |
| 7,382,049 B2 | 6/2008 | Ho et al. |
| 7,453,157 B2 | 11/2008 | Haba et al. |
| 7,528,008 B2 | 5/2009 | Fjelstad |
| 7,667,144 B2 | 2/2010 | Lee et al. |
| 7,767,497 B2 | 8/2010 | Haba |
| 2001/0020737 A1 | 9/2001 | Kwon et al. |
| 2001/0037896 A1 | 11/2001 | Asai et al. |
| 2002/0056896 A1 | 5/2002 | Grigg et al. |
| 2002/0135065 A1 | 9/2002 | Zhao et al. |
| 2003/0057534 A1 | 3/2003 | Ho et al. |
| 2003/0127749 A1 | 7/2003 | Lin et al. |
| 2004/0222518 A1 | 11/2004 | Haba et al. |
| 2005/0082649 A1 | 4/2005 | Masumoto |
| 2005/0116326 A1 | 6/2005 | Haba et al. |
| 2005/0121759 A1 | 6/2005 | Lopez |
| 2005/0133929 A1 | 6/2005 | Howard |
| 2005/0167794 A1 | 8/2005 | Kloen et al. |
| 2005/0173805 A1 | 8/2005 | Damberg et al. |
| 2005/0181544 A1 | 8/2005 | Haba et al. |
| 2005/0181655 A1 | 8/2005 | Haba et al. |
| 2005/0285246 A1 | 12/2005 | Haba et al. |
| 2006/0040488 A1 | 2/2006 | Fjelstad |
| 2006/0051910 A1* | 3/2006 | Tanabe ............... H01L 27/11502 438/152 |
| 2006/0137905 A1* | 6/2006 | Kariya ................. H05K 1/162 174/255 |
| 2006/0151827 A1* | 7/2006 | Kumazaki ............. H01L 21/84 257/318 |
| 2007/0013049 A1 | 1/2007 | Asai et al. |
| 2007/0066046 A1 | 3/2007 | Fjelstad |
| 2007/0205496 A1 | 9/2007 | Haba et al. |
| 2008/0116544 A1 | 5/2008 | Grinman et al. |
| 2008/0272502 A1 | 11/2008 | Nakasato et al. |
| 2009/0001604 A1 | 1/2009 | Tanaka et al. |
| 2009/0020322 A1 | 1/2009 | Hsu |
| 2009/0101393 A1 | 4/2009 | Kim et al. |
| 2009/0236406 A1 | 9/2009 | Fjelstad |
| 2009/0294993 A1 | 12/2009 | Hsu |
| 2010/0002406 A1* | 1/2010 | Hsu ................... H01L 23/49822 361/764 |
| 2010/0096744 A1* | 4/2010 | Mori .................. H01L 21/4853 257/698 |
| 2010/0155932 A1* | 6/2010 | Gambino ............ G06F 17/5068 257/698 |
| 2010/0224987 A1 | 9/2010 | Hochstenbach |
| 2010/0230735 A1* | 9/2010 | Zhu ................... H01L 27/10805 257/301 |
| 2011/0031606 A1* | 2/2011 | Chen .................. H01L 23/3121 257/690 |
| 2011/0057305 A1* | 3/2011 | Chia .................. H01L 23/3171 257/700 |
| 2011/0168434 A1* | 7/2011 | Farooq ................ H01L 21/2007 174/257 |
| 2012/0018870 A1* | 1/2012 | Chang .................. H01L 21/561 257/692 |
| 2012/0032337 A1* | 2/2012 | Lu ....................... H01L 21/4853 257/773 |
| 2012/0038044 A1* | 2/2012 | Chang .................... H01L 24/20 257/738 |
| 2012/0056279 A1* | 3/2012 | Huang .................. B81B 7/007 257/415 |
| 2012/0146223 A1* | 6/2012 | Zhao .................... H01L 27/101 257/751 |
| 2012/0187545 A1* | 7/2012 | Khan .................... H01L 21/561 257/621 |
| 2012/0286416 A1* | 11/2012 | Sato ........................ H01L 24/97 257/737 |
| 2014/0210083 A1* | 7/2014 | Zhao ...................... H01L 24/14 257/738 |
| 2016/0233165 A1* | 8/2016 | Oganesian ............ H01L 23/481 |

FOREIGN PATENT DOCUMENTS

| | | |
|---|---|---|
| JP | 61-177759 | 8/1986 |
| JP | 3-215991 | 9/1991 |
| JP | 3-269977 | 12/1991 |
| JP | 4-280458 | 10/1992 |
| JP | 5-251455 A | 9/1993 |
| JP | 62-68015 A | 9/1994 |
| JP | 2000-269369 A | 9/2000 |

OTHER PUBLICATIONS

U.S. Appl. No. 13/105,325, filed May 11, 2011.
U.S. Appl. No. 13/155,552, filed Jun. 8, 2011.
Lin, Charles, Sam Chiang and Andrew Yang, "Bumpless 3D Stacked Packages," Bridge Semiconductor Corp., Mar. 12, 2003.
Neo-Manhattan Technology, A Novel HDI Manufacturing Process, "High-Density Interconnects for Advanced Flex Substrates & 3-D Package Stacking," IPC Flex & Chips Symposium, Tempe, AZ, Feb. 11-12, 2003.
North Corporation, "Processed Intra-Layer Interconnection Material for PWBs [Etched Copper Bump with Copper Foil]," NMBI™, Version 2001.6.
Otsuka et al., "High Reliability of New Silicone Gel Sealing in Accelerated Environment Test", 1986, pp. 720-726, International Electronics Packaging Society Inc., Wheaton, IL, USA.

* cited by examiner

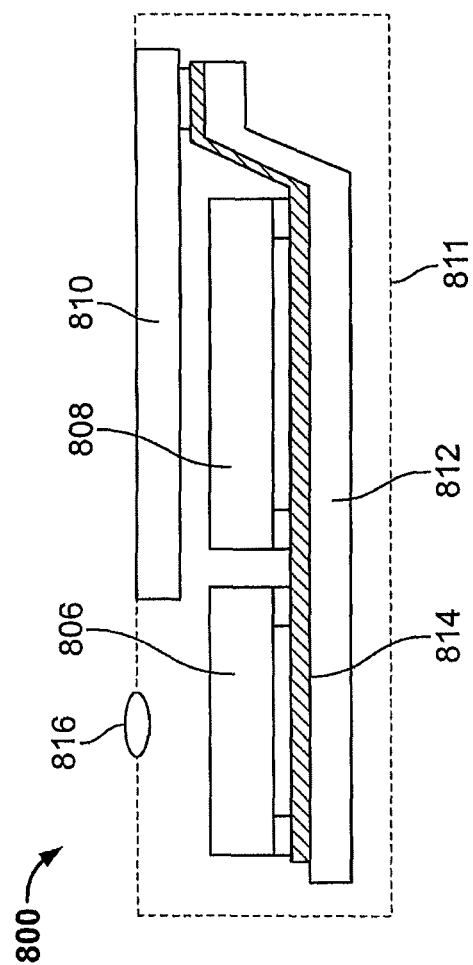

SEMICONDUCTOR CHIP ASSEMBLY AND METHOD FOR MAKING SAME

CROSS-REFERENCE TO RELATED APPLICATION

The present application is a divisional of U.S. patent application Ser. No. 13/157,722, filed Jun. 10, 2011, now issuing as U.S. Pat. No. 9,137,903 on Sep. 15, 2015, which claims priority from U.S. Provisional Application No. 61/425,432, filed Dec. 21, 2010, the disclosures of which are hereby incorporated herein by reference.

BACKGROUND OF THE INVENTION

The subject matter shown and described in the present application relates to assemblies incorporating semiconductor chips and to methods and components useful in making such assemblies.

Modern electronic devices utilize semiconductor chips, commonly referred to as "integrated circuits" which incorporate numerous electronic elements. These chips are mounted on substrates which physically support the chips and electrically interconnect each chip with other elements of the circuit. The substrate may be a part of a discrete chip package or microelectronic assembly used to hold a single chip and equipped with terminals for interconnection to external circuit elements. Such substrates may be secured to an external circuit board or chassis. Alternatively, in a so-called "hybrid circuit" one or more chips are mounted directly to a substrate forming a circuit panel arranged to interconnect the chips and the other circuit elements mounted to the substrate. In either case, the chip must be securely held on the substrate and must be provided with reliable electrical interconnection to the substrate.

In a microelectronic assembly, structures electrically interconnecting a chip to a substrate ordinarily are subject to substantial strain caused by thermal excursions or cycling between low and high temperatures as temperatures within the device change, such as may occur during fabrication, operation or testing of the device. For example, during operation, the electrical power dissipated within the chip tends to heat the chip and substrate, so that the temperatures of the chip and substrate rise each time the device is turned on and fall each time the device is turned off. As the chip and the substrate ordinarily are formed from different materials having different coefficients of thermal expansion, the chip and substrate ordinarily expand and contract by different amounts. This causes electrical contacts on the chip to move relative to electrical contact pads on the substrate as the temperature of the chip and the substrate changes. This relative movement can deform electrical interconnections between the chip and substrate and places them under mechanical stress. These stresses are applied repeatedly with repeated operation of the device, and can cause breakage of the electrical interconnections, which in turn reduces reliability performance of the device. Thermal cycling stresses may occur even where the chip and substrate are formed from like materials having similar coefficients of thermal expansion, because the temperature of the chip may increase more rapidly than the temperature of the substrate when power is first applied to the chip.

Improvements can be made to structures that provide for electrical interconnection of a chip to a substrate of a microelectronic assembly and the processes used to fabricate such structures.

SUMMARY OF THE INVENTION

In accordance with one embodiment of the invention, a microelectronic assembly may include a microelectronic element having a plurality of contacts exposed at a face thereof, and a substrate. The substrate may include a first dielectric layer having electrically conductive elements thereon and a coefficient of thermal expansion of at least 10 parts per million/° C.; and a second dielectric layer overlying the first dielectric layer, having a surface confronting the face of the microelectronic element, and having a Young's modulus of less than about 2 GPa. In addition, the substrate may include a plurality of electrically conductive substrate contacts exposed at the surface and respectively overlying the conductive elements. Further, the substrate may include a plurality of conductive vias extending through the second dielectric layer. The conductive vias may electrically connect the conductive elements with the respective substrate contacts and be disposed entirely below the respective substrate contacts. Further, the substrate contacts may be joined respectively to the contacts of the microelectronic element.

In accordance with another embodiment of the invention, a method for forming a microelectronic assembly may include providing a substrate including a first dielectric layer having a first composition having electrically conductive elements thereon, the first dielectric layer having a coefficient of thermal expansion of at least 10 parts per million/° C.; forming a second dielectric layer overlying the first dielectric layer having a surface at which electrically conductive substrate contacts respectively overlying the conductive elements are exposed, the second dielectric layer having a Young's modulus of less than about 2 GPa; electrically connecting the conductive elements respectively with the substrate contacts by conductive vias extending through the second dielectric layer, the vias being disposed entirely below the respective substrate contacts; and joining the substrate contacts to respective contacts exposed at a face of a microelectronic element, the surface of the substrate confronting the face of the microelectronic element.

In accordance with a further embodiment of the invention, a microelectronic assembly may include an element having a coefficient of thermal expansion less than 10 parts per million/4° C. and a plurality of contacts exposed at a face thereof, and a substrate. The substrate may include a first dielectric layer having a first composition having electrically conductive elements thereon, the first dielectric layer having a coefficient of thermal expansion of at least 10 parts per million/° C.; a second dielectric layer overlying the first dielectric layer and having a surface confronting the face of the microelectronic element, the substrate having a plurality of electrically conductive substrate contacts exposed at the surface and respectively overlying the conductive elements, and the second dielectric layer having a Young's modulus of less than about 2 GPa; and a plurality of conductive vias extending through the second dielectric layer, electrically connecting the conductive elements with the respective substrate contacts and being disposed entirely below the respective substrate contacts. Further, the substrate contacts may be joined respectively to the contacts of the microelectronic element.

In accordance with another embodiment of the invention, a microelectronic assembly may include a substrate. The substrate may include a dielectric element having first and second opposed surfaces, a first dielectric layer having a first material structure adjacent the first surface, and a second dielectric layer having a second material structure different from the first material structure. The second dielectric layer may be disposed between the first dielectric layer and the second surface, the first dielectric layer may have a Young's modulus less than two gigapascal (GPa), and a Young's modulus of the second dielectric layer may be at least 50% greater than the Young's modulus of the first dielectric layer. The substrate further may include a plurality of substrate contacts at the first surface; a plurality of terminals at the second surface; and a conductive structure extending through the first and second dielectric layers and electrically connecting the substrate contacts with the terminals. The assembly may further include a microelectronic element having a face confronting the first surface and a plurality of element contacts thereon joined with the substrate contacts through conductive masses; and a rigid underfill between the face of the microelectronic element and the first surface. Further, the terminals may be usable for bonding the microelectronic assembly to corresponding contacts of a component external to the microelectronic assembly.

In accordance with another embodiment of the invention, a microelectronic assembly may include a substrate, and the substrate may include a dielectric element having first and second opposed surfaces, a first dielectric layer having a first material structure adjacent the first surface and a second dielectric layer having a second material structure different from the first material structure. The second dielectric layer may be disposed between the first dielectric layer and the second surface, the first dielectric layer may have a Young's modulus less than two gigapascal (GPa), and a Young's modulus of the second dielectric layer may be at least 50% greater than the Young's modulus of the first dielectric layer. The substrate may further include a plurality of substrate contacts at the first surface; a plurality of terminals at the second surface; and a conductive structure extending through the first and second dielectric layers and electrically connecting the substrate contacts with the terminals. The assembly may further include a microelectronic element having a face confronting the first surface and a plurality of element contacts thereon joined with the substrate contacts through conductive masses; and a rigid underfill between the face of the microelectronic element and the first surface. Further, the terminals may be usable for bonding the microelectronic assembly to corresponding contacts of a component external to the microelectronic assembly such that the substrate contacts are movable with respect to the terminals.

In accordance with another embodiment of the invention, a method of fabricating a microelectronic assembly may include joining element contacts at a face of a microelectronic element with a plurality of substrate contacts at a first surface of a dielectric element of a substrate confronting the face through conductive masses. The dielectric element may have a conductive element at a second surface opposed to the first surface, a first dielectric layer having a first material structure adjacent the first surface, and a second dielectric layer having a second material structure different from the first material structure. The second dielectric layer may be disposed between the first dielectric layer and the second surface, the first dielectric layer may have a Young's modulus less than two gigapascal (GPa), a Young's modulus of the second dielectric layer may be at least 50% greater than the Young's modulus of the first dielectric layer, and the substrate may include a conductive structure extending through the first and second dielectric layers. The method may further include forming a rigid underfill between the face of the microelectronic element and the first surface of the dielectric element; and patterning the conductive element after the joining step to form terminals at the second surface of the dielectric element. The substrate contacts may be electrically connected with the terminals through the conductive structure, and the terminals may be usable to electrically connect the microelectronic assembly to a component external to the microelectronic assembly.

BRIEF DESCRIPTION OF THE DRAWINGS

FIG. 12 is a schematic depiction of a system according to one embodiment of the invention.

DETAILED DESCRIPTION

Figure 1:
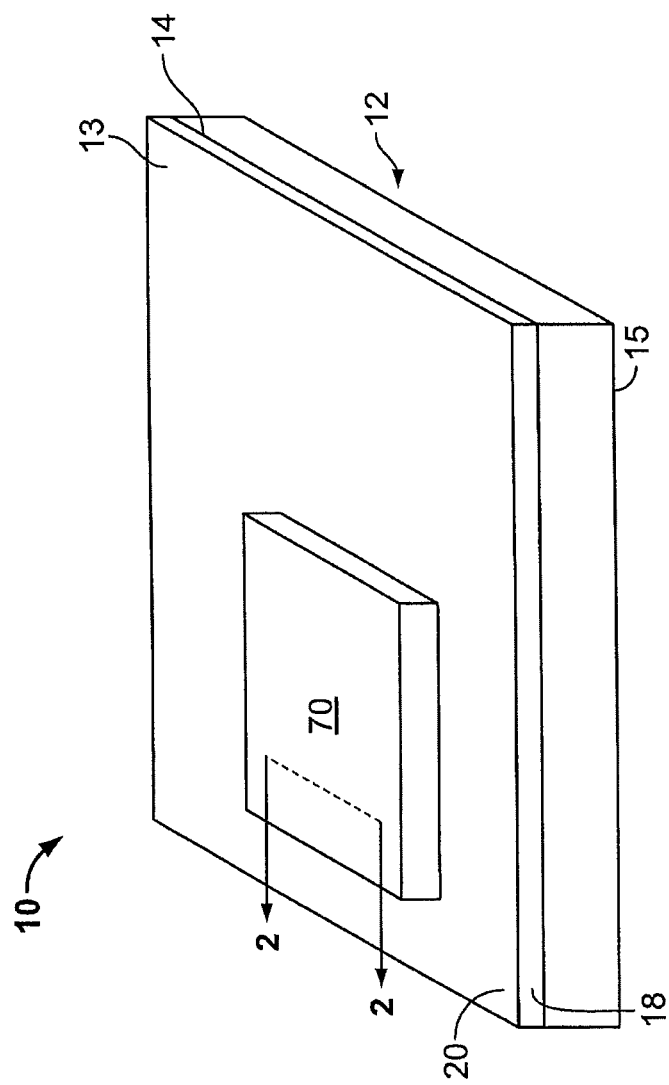
FIG. 1 is a diagrammatic perspective view of a microelectronic assembly, in accordance with one embodiment of the invention.
Figure 2:
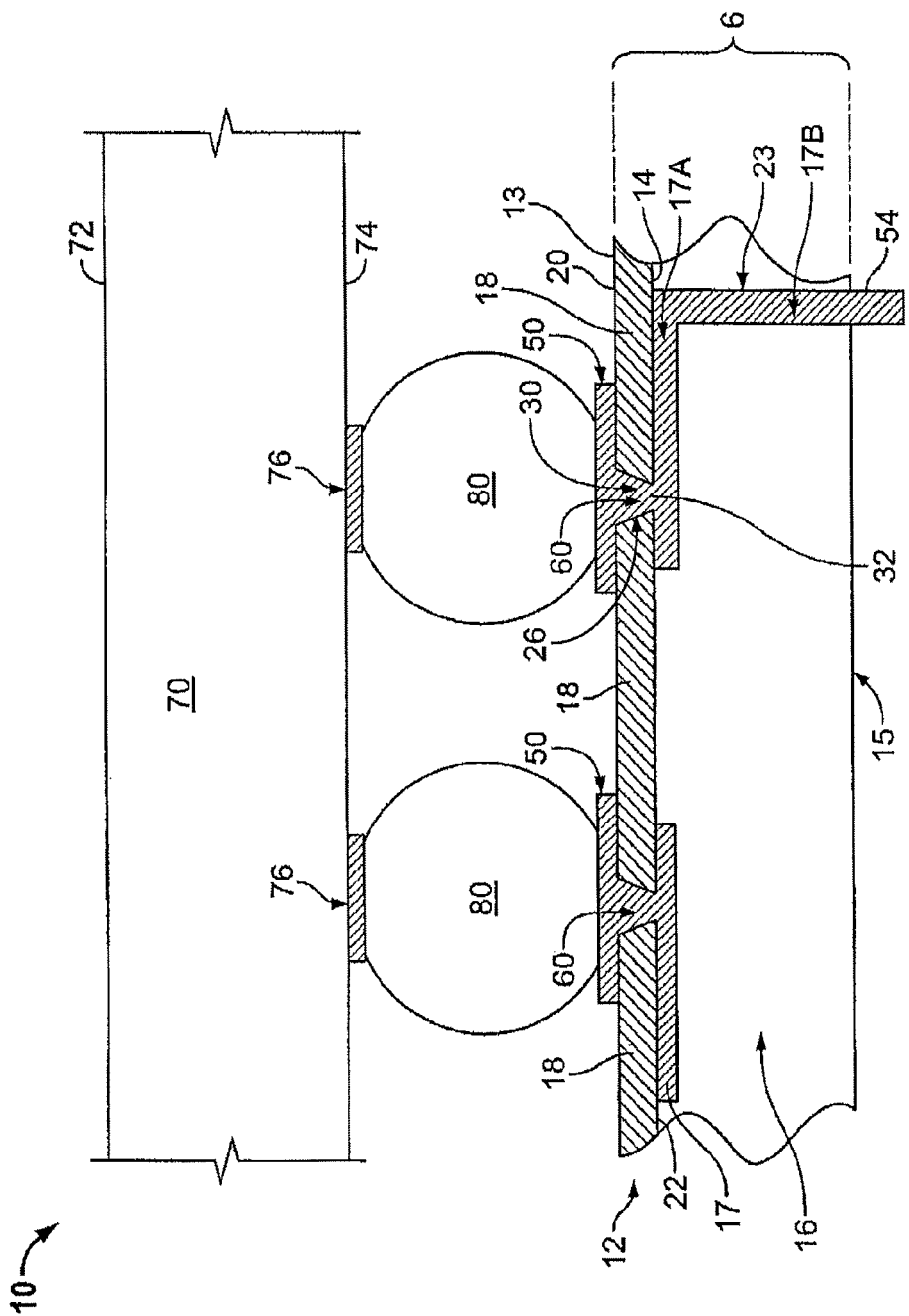
FIG. 2 is a fragmentary sectional view taken along line 2-2 in FIG. 1.

A microelectronic assembly 10 in accordance with an embodiment of the present invention for mounting a microelectronic element, such as a semiconductor chip, thereto is shown in FIGS. 1 and 2. The assembly 10 may include an interconnection substrate 12 having a top surface 13 and an opposing rear surface 15. The substrate 12 may contain a dielectric layer 16 having a top surface 14 facing the top surface 13 of the substrate 12. The dielectric layer 16 may have a thickness extending between the top surface 14 and the rear surface 15 of the substrate 12 in a direction perpendicular to the top surface 13 of about 100 to 1000 microns. In one embodiment, the dielectric layer 16 may have a rear surface that is at least partially coextensive with the rear surface 15 of the substrate 12. The dielectric layer 16 may be formed from epoxy, epoxy-based materials, such as epoxy-glass, polyimide-based materials or BT resin. In addition, the dielectric layer 16 may have a Young's modulus of at least about 2 GPa, and most desirably about 6-10 GPa, and a coefficient of thermal of expansion of at least about 10 parts per million/° C.

As used in this disclosure, terms such as "top", "bottom", "upward" or "upwardly" and "downward" or "downwardly" refer to the frame of reference of a microelectronic assembly, or an assembly or unit which incorporates such microelectronic assembly. These terms do not refer to the normal gravitational frame of reference. For ease of reference, directions are stated in this disclosure with reference to the "top" or "front" surface of the substrate 12. Generally, directions referred to as "upward" or "rising from" shall refer to the direction orthogonal and away from the front surface 13. Directions referred to as "downward" shall refer to the directions orthogonal to the front surface 13 and opposite the upward direction. A "vertical" direction shall refer to a direction orthogonal to the front surface. The term "above" a reference point shall refer to a point upward of the reference point, and the term "below" a reference point shall refer to a point downward of the reference point. The "top" of any individual element shall refer to the point or points of that element which extend furthest in the upward direction, and the term "bottom" of any element shall refer to the point or points of that element which extend furthest in the downward direction.

The substrate 12 may further include electrically conductive elements 17 disposed on the top surface 14 of the dielectric layer 16. The conductive elements 17 may include a conductive strip or trace 17A exposed at the top surface 14 of the dielectric layer 16 and extending substantially parallel to the top surface 13 of the substrate, and a conductive leg 17B electrically connected to the strip 17A. The conductive elements may be formed from etchable conductive material, and typically are or consist essentially of metal including one or more metals selected from copper-based alloy, aluminum, nickel and gold. The conductive leg 17B may extend from the strip 17A, in a direction perpendicular to the direction that the strip 17A extends, as a conductive via extending through openings 23 extending through the thickness of the dielectric layer 16, to or adjacent to the rear surface 15 of the substrate. The conductive elements may provide for connections to other discrete components (not shown) arranged on or formed at least partially within the substrate 12, or to external connections 54, such as conductive material serving as a terminal formed at the rear surface 15 and electrically connected to the conductive leg 17B. In one embodiment, the conductive strip 17A may be an electrically conductive pad.

As used in this disclosure, a statement that an electrically conductive structure is "exposed at" a surface of a dielectric structure indicates that the electrically conductive structure is available for contact with a theoretical point moving in a direction perpendicular to the surface of the dielectric structure toward the surface of the dielectric structure from outside the dielectric structure. Thus, a terminal or other conductive structure which is exposed at a surface of a dielectric structure may project from such surface; may be flush with such surface; or may be recessed relative to such surface and exposed through a hole or depression in the dielectric.

A compliant dielectric layer 18 may be disposed over the top surface 14 of the dielectric layer 16. The compliant dielectric layer 18 may have a height extending from a generally planar top surface 20, which may form a portion of the top surface 13 of the substrate, to an opposing generally planar bottom surface 22, which faces the top surface 14 of the dielectric layer 16, of about 10 to 50 microns. The compliant dielectric layer 18 may be formed from a material having a relatively low elastic modulus, for example, a Young's modulus of less than about 2 GPa. In a particular embodiment, the compliant dielectric layer can have elastic properties comparable to those of soft rubber about 20 to 70 Shore A durometer hardness. For example, the compliant dielectric layer may be a dielectric, and have a material structure formed from materials having a density or hardness of a material used as a filler in compositions such as flexibilized epoxy, silicone, a low modulus epoxy, a TEFLON based material, a foam type material, a liquid-crystal polymer, a thermoset polymer, a fluoropolymer, a thermoplastic polymer, polyimide, polytetrafluoroethylene (PTFE), perfluoroalkoxy (PFA), fluorinated ethylene propylene (FEP) and polyfluoroethylene (PTFE) or like compositions.

In one embodiment, the compliant dielectric layer 18 may be provided in the substrate 12 with the dielectric layer 16 as a dielectric element 6 in which the dielectric layer 16 has a Young's modulus that is at least 50% greater than the Young's modulus of the compliant dielectric layer 18. The dielectric layer 16 may have a material structure formed from materials having a density or hardness of a material used as a filler in compositions such as filled epoxy, epoxy glass, epoxy glass composite, glass woven material, ceramic or like materials. The layer 16, hence, may have a material structure different from the material structure of the compliant dielectric layer of the dielectric element 6, the difference in the material structure being based on the difference between the density or hardness of a material used as a filler in the layer 16 and the density or hardness of a material used as a filler in the compliant dielectric layer 18. As discussed in further detail below, a substrate of a microelectronic assembly containing the dielectric element 6 may reduce mechanical stress between microelectronic elements, which are electrically connected to substrate contacts at a top surface of the substrate, and terminals at a rear surface of the substrate which are electrically connected to contacts of a microelectronic component external to the microelectronic assembly. In addition, it is to be understood that the terms "compliant" for designating the layer 18 and "rigid" for designating the layer 16 are used herein for convenience to describe the layers 18 and 16, and in embodiments of the present invention, the substrate may include a dielectric element having a first dielectric layer, such as the layer 18, which is adjacent a first surface of the dielectric element at which microelectronic element contacts are to be joined, and a second dielectric layer, such as the layer 16, which is between the first dielectric layer and a second surface of the dielectric element opposed to the first surface, where the second dielectric layer has a Young's modulus at least 50% greater than the Young's modulus of the first dielectric layer.

Referring to FIG. 2, the compliant dielectric layer 18 can have openings extending through an entirety of the thickness of the layer 18, through which portions of respective conductive strips 17A are exposed. The openings 26 may be substantially cone-shaped or cylindrically-shaped having substantially circularly-shaped top ends 30 at the top surface 20 of the compliant layer 18 and substantially circularly-shaped bottom ends 32 adjacent the conductive strips 17A. The diameter or width of the top ends 30 of the openings 26 may be about 30-40 microns, and the diameter or width of the bottom ends 32 of the openings 26 may be about 20-40 microns. In some examples, the width of the bottom end of the opening 26 can be smaller than the width at the top end; in another example, the bottom end width of the opening 26 can be the same as the top end width.

The substrate 12 may further include electrically conductive contacts 50, such as contact pads, exposed at the top surface 20 of the compliant dielectric layer 18.

The substrate contacts 50 overlie openings 26 formed over respective conductive strips 17A, and may at least partially overlie portions of the compliant dielectric layer 18 adjacent the openings 26. The contacts may have a height in a direction perpendicular to the top surface 20 of the compliant layer of less than about 20 microns.

Electrically conductive vias 60 may extend from the substrate contacts 50, into the openings 26 and through the entire thickness of the compliant dielectric layer 18, to exposed portions of the conductive strips 17A underlying the openings 26, so as to electrically connect the conductive strips 17A with respective substrate contacts 50. The vias 60 desirably are disposed entirely below the respective substrate contacts from which they extend, and fill the entirety of the openings 26 so as to have the same structure as the openings.

An element 70, such as a microelectronic element, for example, a semiconductor chip, having a generally planar rear face 72 and a generally planar front face 74 with electrical contacts or terminals 76 may be disposed on the substrate 12. The chip 70 may be mounted on the substrate 12 in a front-face-down orientation, with the front face 74 of the chip facing toward the top surface 20 of the compliant layer 18. The electrical contacts 76 may be electrically connected to internal electronic components (not shown) of the chip 70.

In addition, each of the electrical contacts 76 may be associated with one of the contact pads 50, and each of the contacts 76 is bonded to the associated contact pad by a mass 80 of electrically conductive material. Thus, the contacts 76 on the chip 70 are electrically interconnected, via the masses 80, the contact pads 50 and the conductive vias 60, to the associated conductive strips 17A underlying the compliant layer 18. The masses 80 may include a bond metal such as solder, which may or may not be lead-free, tin or indium.

As will be seen in the various embodiments provided herein, the dielectric element of the substrate may include one or more layers of compliant dielectric material and have conductive vias extending through a thickness of the one or more compliant dielectric layers, and one or more layers of rigid dielectric material and have conductive material, such as conductive legs or conductive vias, extending through a thickness of the one or more rigid layers, where substrate contacts are at a surface of a compliant dielectric layer of the dielectric element.

In accordance with one embodiment, the structural and material characteristics of the substrate contacts and the dielectric element, which includes a compliant dielectric layer adjacent the substrate contacts, a rigid layer and conductive elements between and extending through the rigid and compliant layers, may be adapted to permit displacement of the substrate contacts relative to the conductive elements, and provide that the displacement appreciably relieves mechanical stresses, such as may be caused by differential thermal expansion or contraction, which would be present in electrical connections between the substrate contacts and the microelectronic element absent such displacement. In particular, the structural and material characteristics of the substrate contacts, the conductive vias in the compliant layer and the compliant layer may be adapted to permit more movement of the substrate contacts relative to the associated conductive strips, in comparison to the amount of relative movement that would be permitted absent the combination of the compliant layer, the substrate contacts, and the conductive vias in the compliant layer adapted in accordance with the present invention, so as to appreciably reduce mechanical stresses in electrical connections between the associated contacts of the substrate and the chip.

As used in the claims with respect to contacts of a substrate joined to a microelectronic element, the term "movable" means that when the assembly is exposed to external loads, such as may occur as a result of thermal excursions during fabrication, testing or operation of the inventive assembly, the contacts are capable of being displaced relative to the conductive strips 17A of the substrate, or terminals at the rear surface of the substrate, by the external loads applied to the substrate contacts through the joints with the contacts of the microelectronic element, to the extent that the displacement appreciably relieves mechanical stresses, such as those caused by differential thermal expansion which would be present in the electrical connections between the microelectronic element and the substrate absent such displacement.

Figure 3:
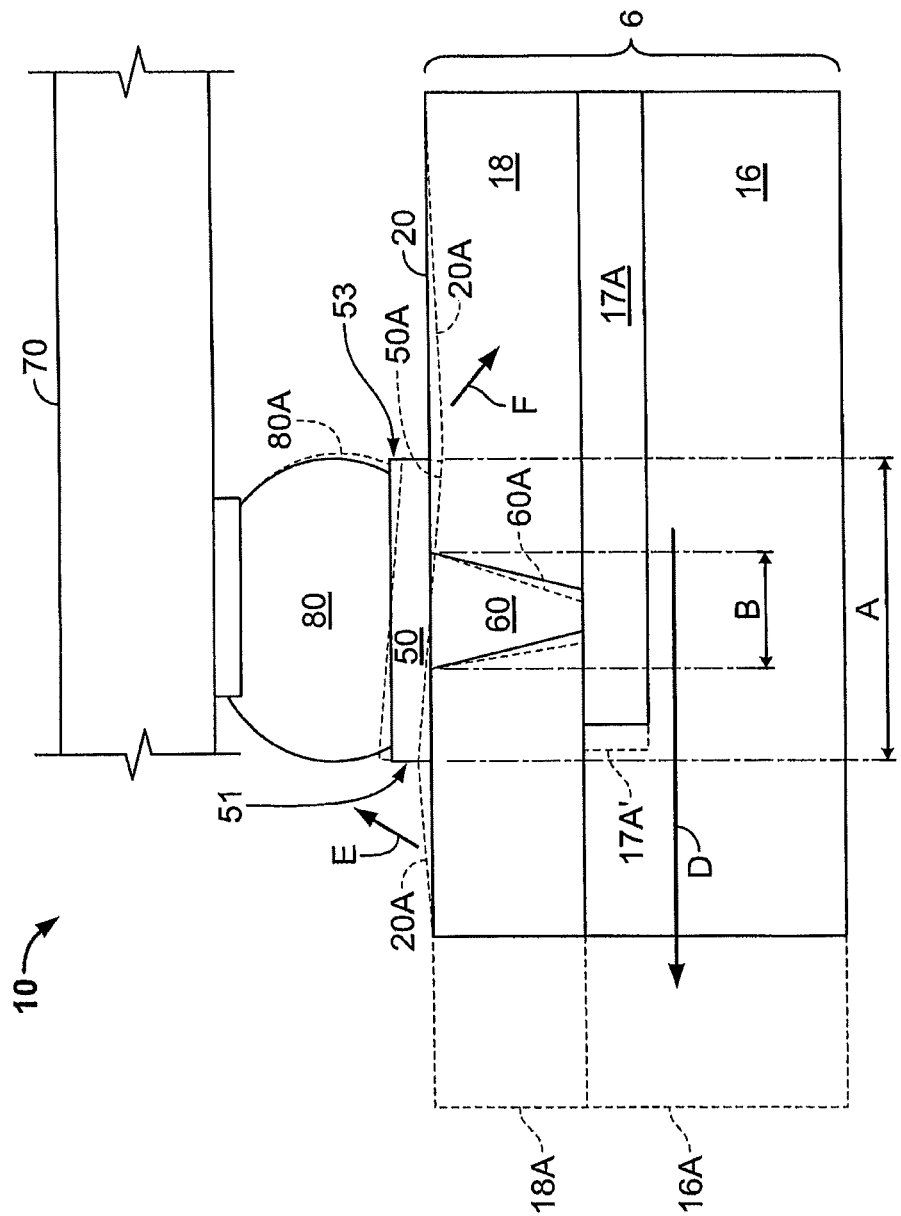
FIG. 3 is fragmentary view, on an enlarged scale, of a portion of the microelectronic assembly shown in FIG. 2

Referring to FIG. 3, the contact, i.e., contact pad 50, and the associated conductive via 60 to a much lesser extent than the contact pad, may be displaced from a normal position (shown in solid lines) to a displaced position (shown in dashed lines), based on deformation of the compliant layer 18 (also shown in dashed lines), such as may be caused by differential thermal expansion or contraction occurring during operation, fabrication or testing of the assembly 10. The amount of movement of the contact pad 50 that is permitted may depend on a diameter A of the contact pad, which is measured in a direction along the top surface 20 of the compliant layer; the diameter B of the surface portion of the conductive via 60 exposed and coupled to the contact pad 50, where such surface portion desirably has the same configuration as the top end 30 of the opening 26; the Young's modulus of the compliant layer; and the height of the conductive via. The capability of the contact pad to move may increase with decreasing ratio of B to A, and the ratio of B to A desirably is at least less than about 40%. In addition, the capability of the contact pad to move may increase with decreasing Young's modulus of the compliant layer in relation to the Young's moduli of the rigid dielectric layer and the chip, and the Young's modulus of the compliant layer desirably may be less than about 2 GPa. Further, the capability of the contact pad to move may increase with increasing height of the conductive pad, and desirably the height is at least 20 microns.

Referring to FIG. 3, the contact pad 50 and the conductive via 60 may be displaced to the positions indicated by broken lines 50A and 60A, respectively, when the substrate 12 with the compliant layer 18, the rigid layer 16 and the conductive strip 17A expand in the direction of arrow D to the positions indicated by broken lines 18A, 16A and 17A'. This displacement is permitted by the flexibility of the compliant layer 18, which may flex and deform at the top surface 20 to obtain an approximated deformed condition indicated by broken lines 20A. As the compliant layer 18 has more compliance than the pad 50 and the conductive via 60, the layer 18 does not substantially resist flexing based on mechanical stresses applied at the contact pads 50 resulting from the differential expansion or contraction of the dielectric element 6 of the substrate and the chip. Upon expansion of the substrate in the direction of the arrow D, the compliant layer may expand in the direction of the arrow E at a side 51 of the contact pad 50 facing the direction in which the expansion is occurring, and compress in the direction of the arrow F at a side 53 of the contact pad 50 opposite the side 51.

The displacement of the contact pad illustrated in FIG. 3, from the normal non-displaced position to the displaced position, thus places the layer 18 partially in compression and expansion, such as may occur when the assembly is exposed to differential thermal expansion or contraction. It is to be understood that, in accordance with the present invention, the conductive pad may also move in other directions, such as opposite to the directions E and F at the opposing sides 51 and when a contraction occurs in a direction opposite to the direction D, and also in directions perpendicular to these directions, into and out of the plane of the drawing as seen in FIG. 3. Thus, the compliant layer may flex to accommodate movement of the contact pad 50 relative to the conductive strip 17A, without deformation of the contact pad, thereby avoiding damage to the contact pad when the assembly is exposed to differential thermal conditions, such as during fabrication, operation or testing of the assembly.

In one embodiment, the dielectric layer 16 may have a coefficient of thermal expansion substantially greater than a coefficient of thermal expansion of the microelectronic element, such that the microelectronic element applies substantial loads to the substrate contacts due to the difference in the coefficients of thermal expansion between the dielectric layer 16 and the microelectronic element.

In one embodiment, the compliant layer may permit displacement to reduce mechanical stress in the electrical connections between the substrate contacts and the microelectronic element to a degree that is appreciably less than the mechanical stress that would be present in electrical connections between the substrate contacts and the microelectronic element absent such displacement. Without the structure of the embodiment, the electrical connections, such as solder, are subject to fatigue failure due to stresses. In one example, a substantial reduction in the stress applied to the electrical connections may be 25%. In another example, about a 50% reduction in the stress applied to the electrical connections may be achieved.

In one embodiment, the compliant layer may permit displacement to appreciably relieve the aforementioned mechanical stresses for temperatures of the assembly and its parts ranging from about −55° C. to 125° C.

Figure 4A:
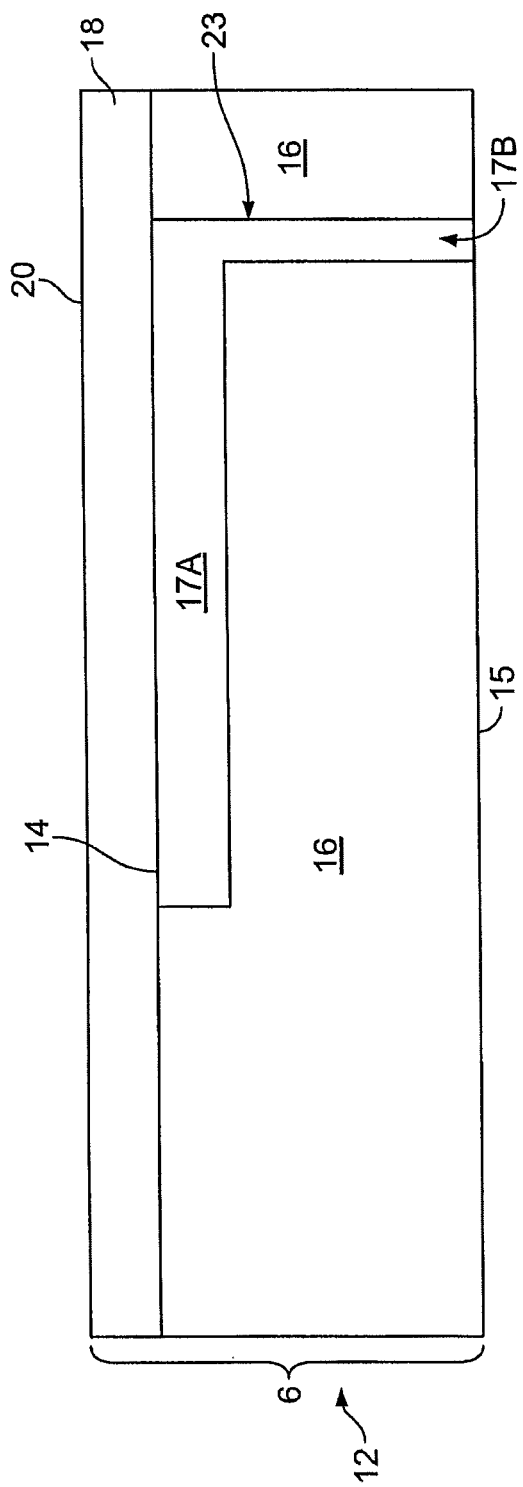
FIGS. 4A-4C are sectional views illustrating stages in a method of fabricating a microelectronic assembly, in accordance with an embodiment of the invention.
Figure 4B:
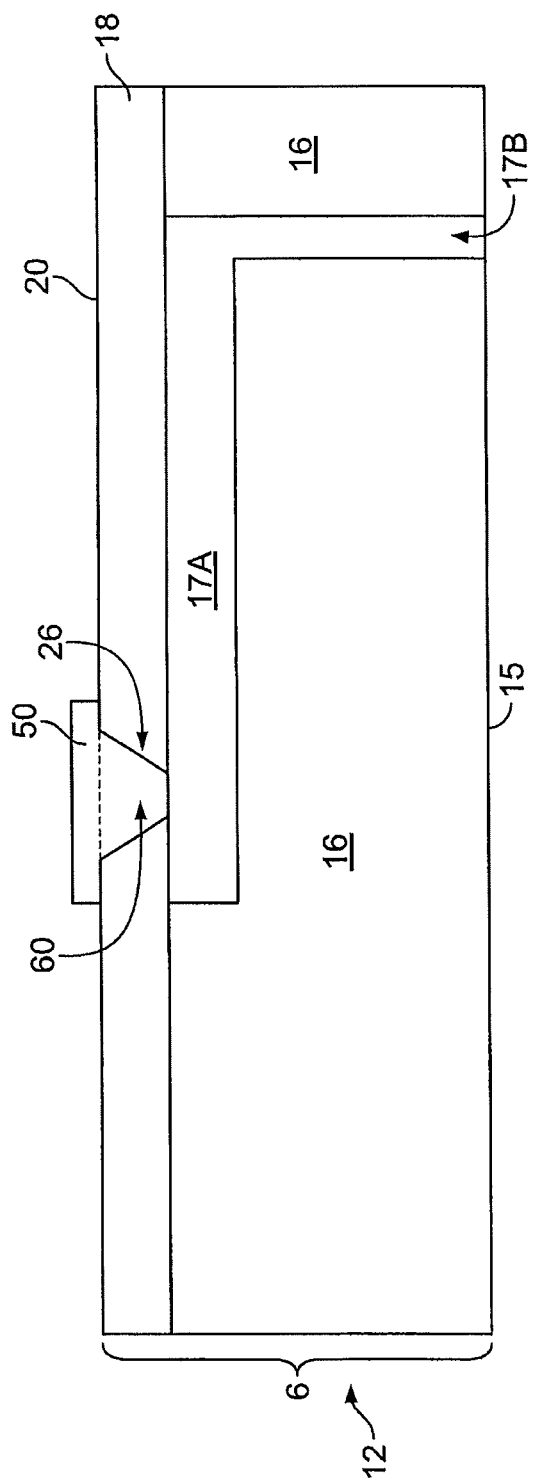
Figure 4C:
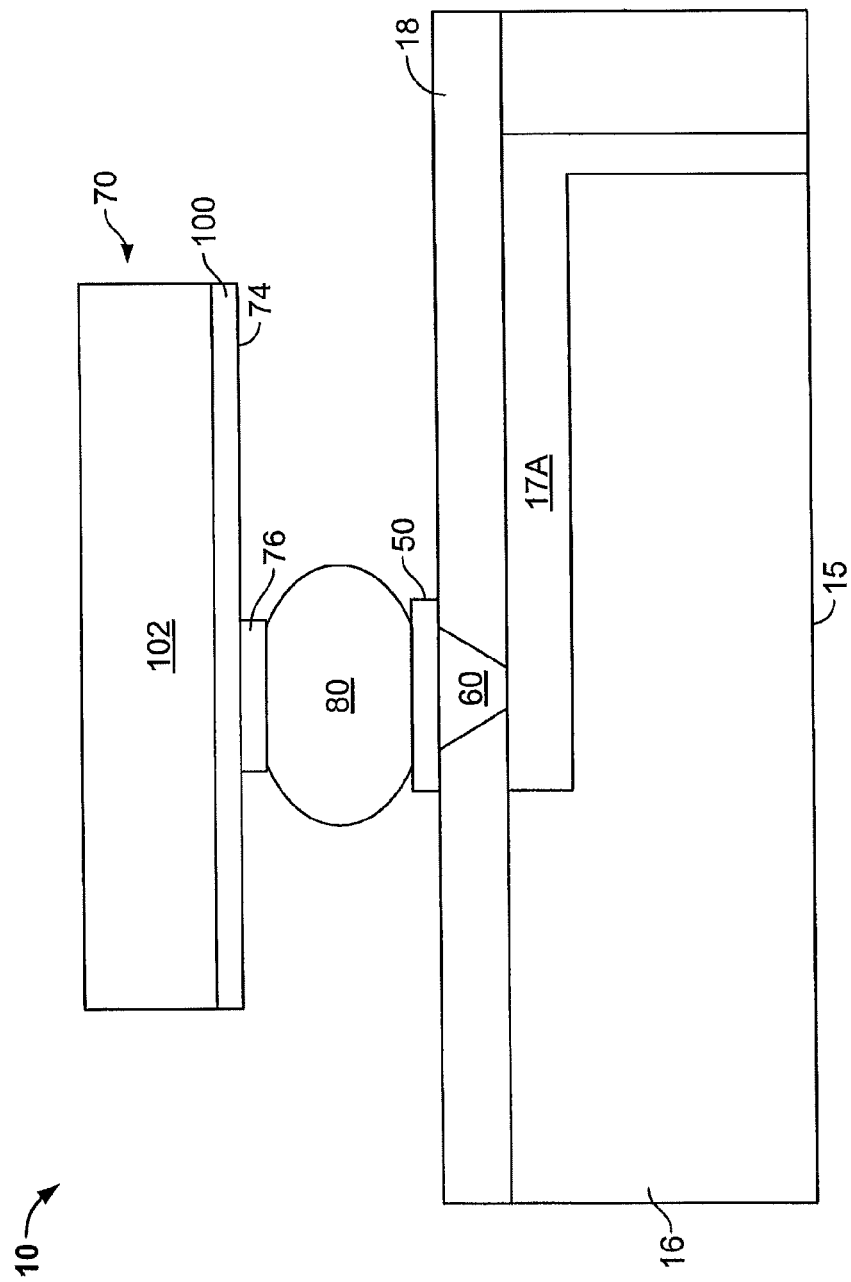

In one embodiment, the assembly 10 may be fabricated by a process as schematically illustrated in FIGS. 4A-4C. For highlighting the features of the present invention, a portion of a single region of the microelectronic assembly 10 showing interconnection of the chip contact with an associated substrate contact is shown in the drawings FIGS. 4A-4C. Although fabrication processing of the assembly 10 is described below with respect to a single contact between the chip and substrate, it is to be understood that the same fabrication processing occurs in the other regions of the assembly 10 to connect chip contacts to associated contact pads on the substrate.

As illustrated in FIG. 4A, in a preliminary stage of fabrication, a semiconductor substrate 12 may be provided including a rigid dielectric layer 16, a conductive strip or trace 17A formed at a top surface 14 of the rigid layer 16 and a conductive leg or via 17B formed to extend from the strip 17A, through a hole 23 extending through the entirety of thickness of the rigid layer 16, to a rear surface 15 of the substrate, where the conductive elements 17 are formed using conventional masking and etching techniques. A compliant dielectric layer 18 may be joined to the substrate to overlie the top surface 14 of rigid layer 16, such as by thin film deposition, silk-screening or using an adhesive (not shown). The adhesive can be any suitable material, and can be epoxy. The adhesive should have properties and a glass transition temperature $T_g$ sufficiently high to withstand the maximum heating to be encountered during subsequent thermal processing and operation. The adhesive may cover exposed portions of the top surfaces of the dielectric element and conductive strip 17A. Preferably, the adhesive is homogeneously applied by spin bonding, as described in U.S. Pat. Nos. 5,980,663 and 6,646,289, the disclosures of which are incorporated herein by reference. Alternatively, any other suitable technique may be employed. In another embodiment, an oxide/nitride layer may be used to join the compliant layer 18 to the substrate 12.

Referring to FIG. 4B, an opening 26 may be formed extending through the entirety of the thickness of the compliant layer 18, and any optional adhesive layer, at a position overlying a conductive strip 17A, using conventional masking and etching processes, so as to expose the conductive strip 17A. In one embodiment, photolithography may be used to form mask patterns (not shown) overlying the front surface of the compliant layer 18, after which the layer 18 may be etched from the front surface 20 using wet or dry etching. In an alternative embodiment, the opening 26 may be formed by laser ablation of the compliant layer 18. In another embodiment, a directed stream of particles can form openings 26 in the compliant layer 18, such as disclosed in commonly owned co-pending U.S. application Ser. No. 12/842,612 filed Jul. 23, 2010, incorporated by reference herein.

Conductive material may then be deposited into, and so as to fill, the opening 26 to form the conductive via 60. In one embodiment, masking and photolithography may be used to deposit the same conductive material used to form the conductive via, to form a contact pad 50 overlying the conductive via, after the opening 26 becomes filled with the conductive material. The contact pad 50 optionally may be formed to overlie a portion of the top surface 20 of the compliant layer 18 adjacent the opening 26 in which the conductive via 60 is formed, as shown in FIG. 4B.

In one embodiment, a contact pad may be formed so that the associated conductive via underlying the contact pad extends from a substantially central region of a surface of the contact pad facing the conductive via.

Alternatively, a metal layer may be selectively formed on an exposed surface of the conductive via at the top surface of the compliant layer, and also on an exposed surface portion of the compliant layer 18 adjacent the conductive via, to form the contact pad 50. The metal layer may be formed by sputtering or blanket metallization, and followed by surface patterning using photolithography. See U.S. Patent Publication No. 2008-0116544, filed Nov. 22, 2006, incorporated by reference herein. Alternatively, the metal layer may be formed by electroless plating.

In another alternative embodiment, a masking dielectric layer (not shown) may be formed patterned on the exposed surface of the compliant layer to define the contact pads 50.

In some embodiments, the substrate 12 including the rigid layer 16, the conductive elements 17, the compliant dielectric layer 18, the conductive vias 26 and the contact pads 50 may be formed by one or more of the processes described in U.S. application Ser. No. 13/105,325 filed May 11, 2011 and U.S. application Ser. No. 13/155,552 filed Jun. 8, 2011, which are incorporated by reference herein.

Referring to FIG. 4C, a solder bump 80 may be formed on the contact pad 50 to electrically interconnect the contact pad 50 with a conductive pad 76 on a front surface 74 of the chip 70, which is disposed overlying the substrate and mounted to the substrate using conventional techniques.

In still a further embodiment, referring to FIG. 4C, the chip 70 may include a dielectric region 100 disposed between the surface 74 and a semiconductor region 102 which may embody active circuit elements. The dielectric region 100 may be an "extremely low dielectric ("ELK") constant 'k'" or "ultralow dielectric constant 'k'" ("ULK") material having a specific material or including a multiplicity of "pores," i.e., voids dispersed throughout the dielectric region 100. In a particular embodiment, the region 100 may have a porosity greater than 20%, 40% or 60% determined as a ratio of the combined volume of all the voids relative to the volume enclosed by exterior surfaces of the dielectric region. The low dielectric constant can be achieved by the chip having substantial porosity, and porosity can cause the material to be relatively fragile.

In one embodiment, the structure and Young's modulus of the compliant layer, and the structure of the conductive vias and the conductive pads may be adapted to have a reduced stiffness in accordance with the ELK characteristics of the dielectric region of the chip, so as to reduce an amount of stress transferred to the dielectric region to below a level which the ELK region can tolerate, and thereby avoid the dielectric region becoming damaged during expansion or contraction of the dielectric element relative to the microelectronic element.

In another embodiment, the element 70 of the microelectronic assembly 10 may have a coefficient of thermal expansion that is less than 10 parts per million/° C. and consist essentially of dielectric material. For example, the element 70 may include glass or ceramic materials.

In a further embodiment, the element 70 may include a plurality of passive components, such as resistors, capacitors or inductors, in any combination, or be a passive chip of semiconductor material.

Figure 5:
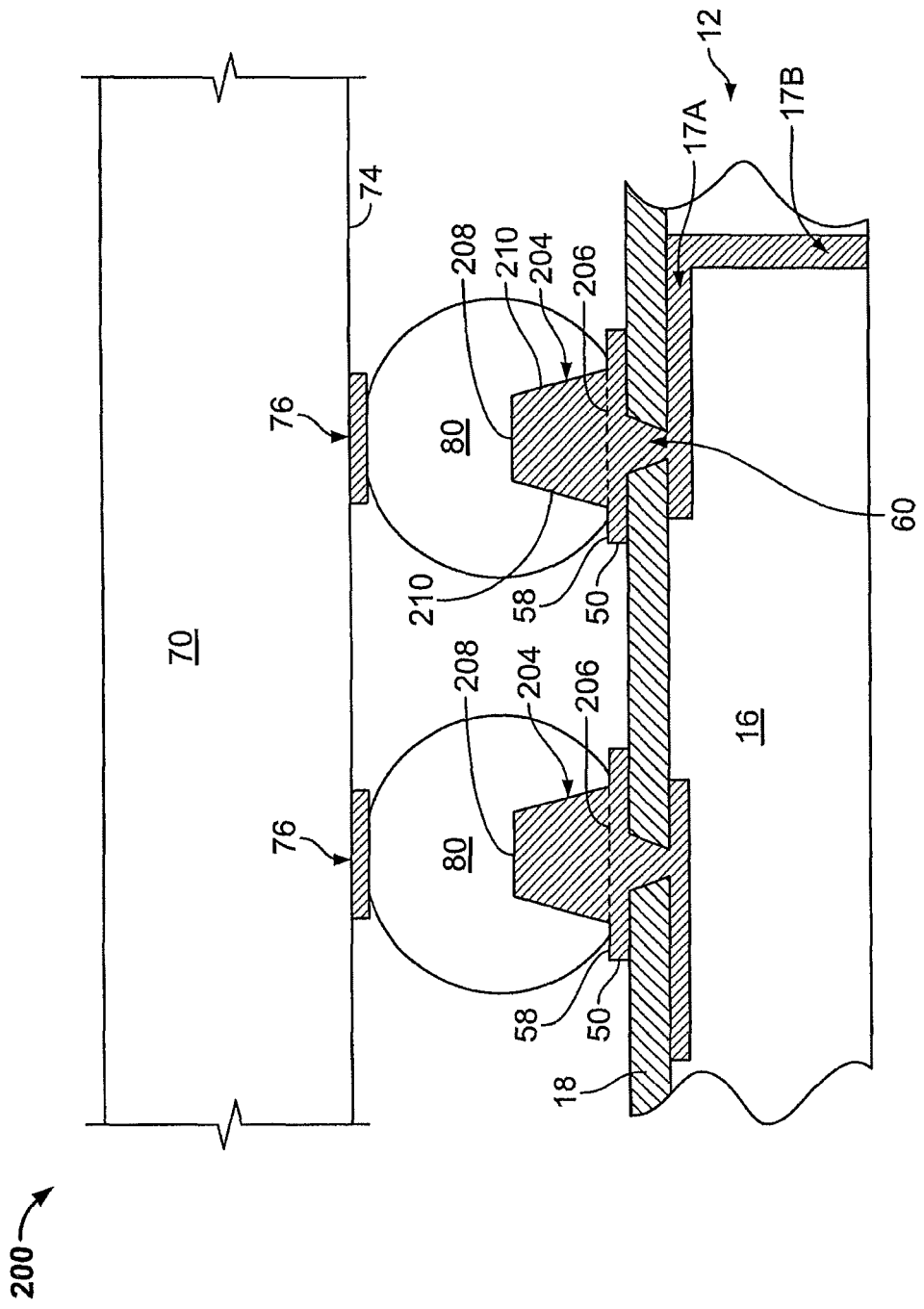
FIG. 5 is a fragmentary sectional view of a microelectronic assembly, in accordance with another embodiment of the invention.

Referring to FIG. 5, in another embodiment, a microelectronic assembly 200 may have a substantially similar construction as the assembly 10 of FIG. 2, except that substantially rigid conductive posts 204 may extend above the compliant layer from exposed surfaces 58 of the contact pads 50 that confront the surface 74 of the chip 70. In one example, the posts 204 may consist essentially of copper, and can be formed by plating or etching or a combination thereof. The posts 204 may extend from a bottom surface 206, which faces the exposed surface 58 of the pads 50, above the compliant layer 18 to a top surface 208 adjacent the surface 74 of the chip 70. The post may have an edge surface extending from the base 206 adjacent pad 206 to an end surface or top surface 208 remote from the base.

Alternatively, the post 204 may include opposing edge surfaces 210 extending from the surface 206 toward each other and terminating at the top surface 208. The height of the post 204 extending between the top surface 208 and the bottom surface 206, in a direction perpendicular to the surface of the compliant layer 18, may be about 10-100 microns. In one embodiment, the post may have a height at least half the distance of the bottom surface 206 extending in directions along the top surface of the compliant layer. The bond metal 80 desirably may contact the top surface and edge surfaces of the post, and optionally a portion of the exposed surface 58 of the contact pad 50.

Figure 6:
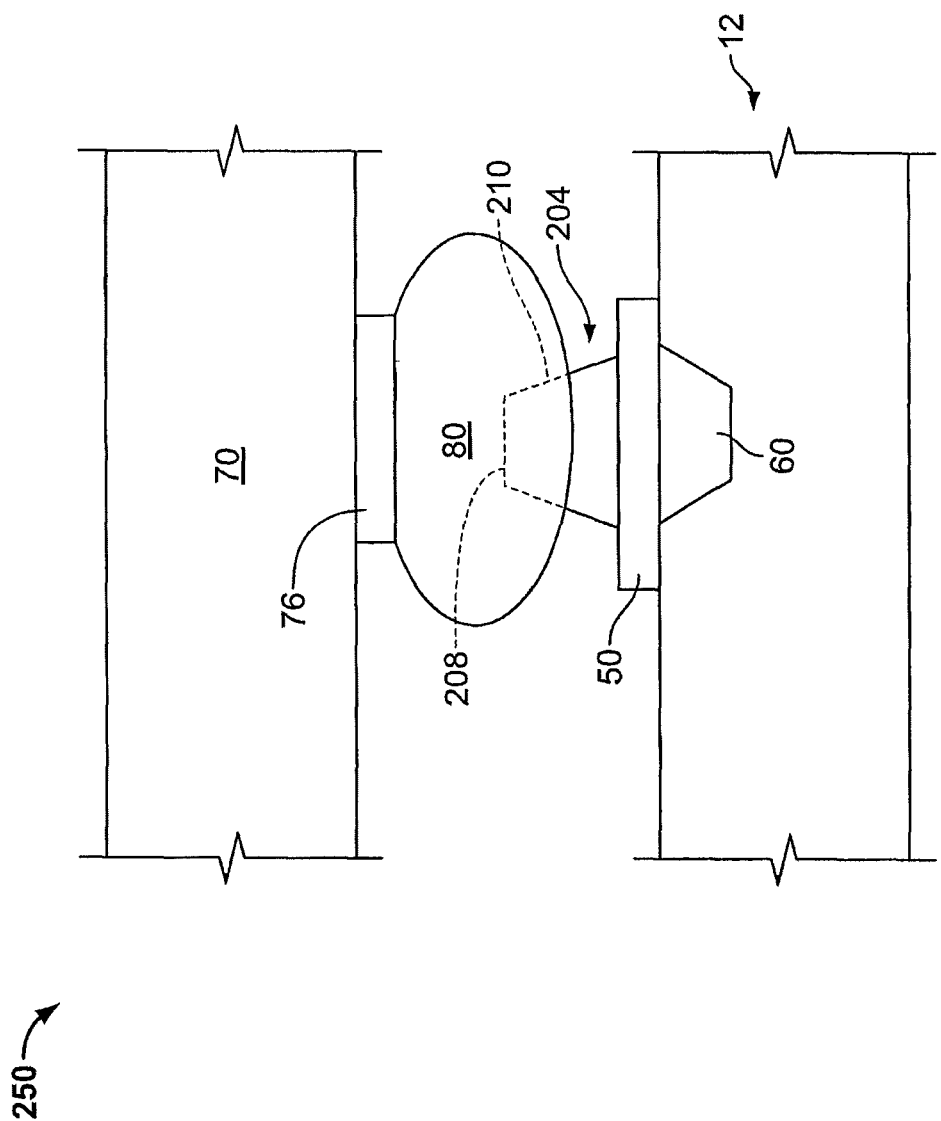
FIG. 6 is a fragmentary sectional view of a microelectronic assembly, in accordance with another embodiment of the invention.

In another embodiment, referring to FIG. 6, a microelectronic assembly 250 may have a substantially similar construction as the assembly 200 of FIG. 5, except that the bond metal 80 may contact the top surface and edge surfaces of the posts but not contact the contact pad 50.

Figure 7:
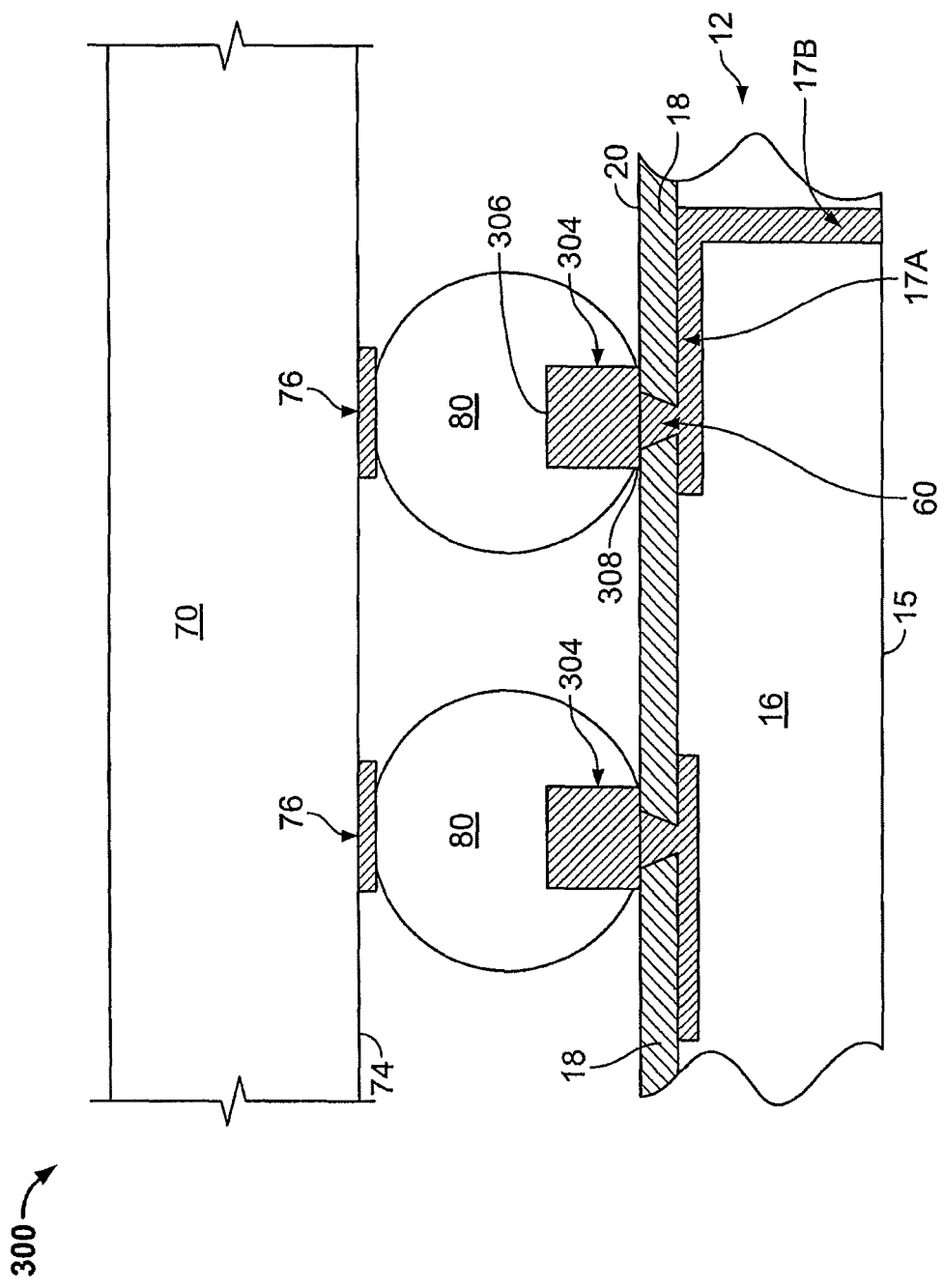
FIG. 7 is a fragmentary sectional view of a microelectronic assembly, in accordance with another embodiment of the invention.

Referring to FIG. 7, in another embodiment, a microelectronic assembly 300 may have a substantially similar construction as the assembly 200 of FIG. 5, except that substantially rigid conductive posts 304 extend from exposed surfaces of the conductive vias 60, and exposed portions of the surface 20 of the compliant layer 18, facing the surface 74 of the chip. The posts 304 may have a square or rectangular shape with a top surface 306 adjacent the chip and a bottom surface 308 opposing the top surface 306. The bottom surface 308 may overlie the exposed surface of the associated conductive via 60 and also portions of the top surface of the compliant layer adjacent the associated conductive via. In one embodiment, the bond metal 80 may contact only the top surface and the edge surfaces of the post 304. In a desired embodiment, the posts 304 may have a height extending between the top and bottom surfaces 306, 308, perpendicular to the surface 20 of the compliant layer 18, of about 20-100 microns.

Figure 8:
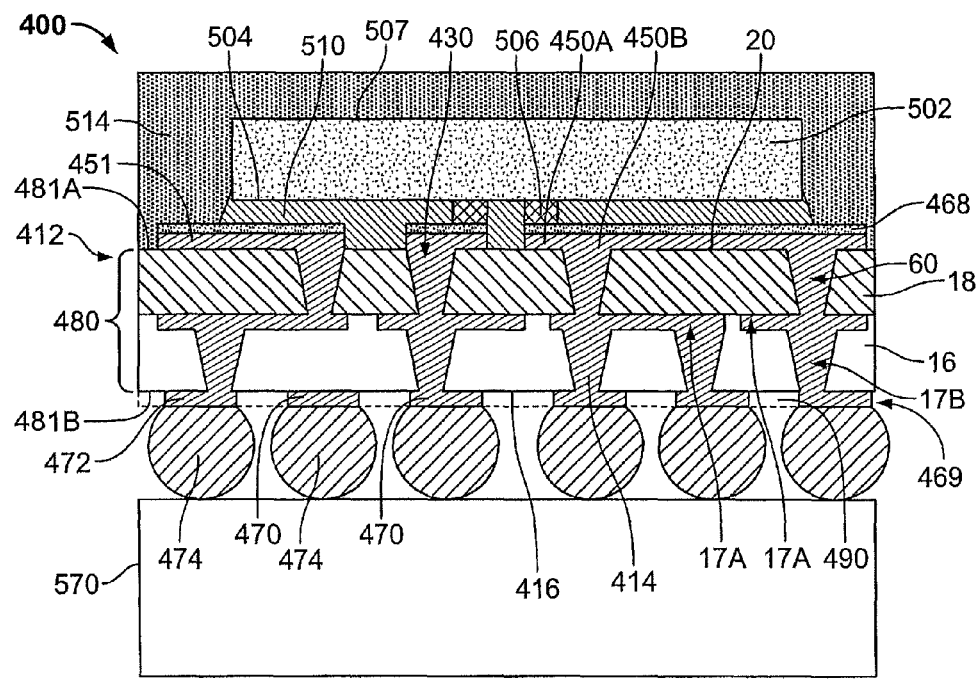
FIG. 8 is a fragmentary sectional view of a microelectronic assembly, in accordance with another embodiment of the invention.

Referring to FIG. 8, in a further embodiment a microelectronic assembly 400 may include a substrate 412, which is fabricated and has features similar to the substrate of the assembly 10 of FIG. 2. Like reference numerals are used in this embodiment to designate the same or similar components as previously discussed. Referring to FIG. 8, a metal layer may be selectively provided on uncovered portions of the top surface 20 of the compliant dielectric layer 18 and on exposed top surfaces 430 of the conductive vias 60 to obtain conductive portions 450. The portions 450 may include contacts 450A adjacent the conductive vias 60, and traces 450B extending along the top surface 20 of the layer 18 from the contacts 450A that may electrically connect the contacts 450A with other conductive elements within or attached to the substrate 412. In addition, the conductive vias 17B may have a construction similar to the conductive vias 60, and also some of the vias 17B may be vertically aligned with the vias 60. Also, the substrate 412 may include conductive portions 470 formed at exposed portions of bottom surfaces 414 of the conductive vias 17B, and uncovered portions of bottom surfaces 416 of the rigid layer 16 which extend from the exposed portions of the bottom surfaces 414. In addition, the conductive portions 470 may be formed at uncovered portions of the bottom surface 416 of the rigid layer that do not extend from the exposed portions of the bottom surfaces 414. The conductive portions 470 may be formed selectively from a layer of metal, using similar techniques as described above to obtain the conductive traces 17A. Some of the conductive portions 470 may be electrically connected with, and optionally extend from, bottom surfaces 414 of the conductive vias 17B.

Further, masses 474 of electrically conductive material, such as solder, may be provided on exposed portions of bottom surfaces 472 of the conductive portions 470. The masses 474 may be obtained, for example, by patterning a solder resist layer on the uncovered portions of the bottom surface 416 of the rigid layer 16, forming conductive material on exposed portions of the surfaces 472, and then removal of the solder resist layer. The masses 474 may be electrically interconnected with the conductive portions 450 through the conductive portions 470, which may include contacts that serve as terminals of the substrate 412, the conductive vias 17B, the traces 17A and the conductive vias 60. In one embodiment, the conductive portions 470 may serve as the terminals of the substrate 412, and partially overlie and be in contact with the conductive vias 17B. The masses 474 may include a bond metal such as solder, which may or may not be lead-free, or such as tin or indium.

Further, the microelectronic assembly 400 may incorporate a microelectronic element 502, such as a semiconductor chip, having a generally planar front face 504, a generally planar rear face 507 and contacts (not shown) exposed at the front face 504. The substrate 412 and the chip 502 may be assembled with the chip 502 mounted on the substrate 412 in a front-face-down orientation, with the front face 504 of the chip facing top surface 451 of the conductive portions 450. The contacts on the chip 502 may be electrically connected to internal electronic components (not shown) of the chip 502.

In addition, the contacts on the surface 504 of the chip may be aligned and bonded with conductive material of the substrate, such as the contacts 450A, or a contact (not shown) on an optional protective layer 468 formed on the upper surfaces 451 of the conductive portions 450, by masses 506 of electrically conductive material. The masses 506 may include a bond metal such as solder, which may or may not be lead-free, or such as tin or indium.

In one embodiment, the protective layer 468 may include a corrosion-resistant or oxidation-resistant metal, such as nickel or gold, or be formed from organic solderability preservative ("OSP") or a flux material. In another embodiment, etch-resistant material used to form the portions 450 may also include a corrosion-resistant metal, such as nickel or gold, such that the material may be left in place as the layer 468 after formation of the portions 450.

In the assembly 400, the traces 450B may extend along the surface 20 of the compliant layer 18 away from the contacts 450A and electrically connect the contacts 450A with the conductive vias 60, which extend downwardly from the traces 450B. The traces 450B may partially overlie and be in contact with the conductive vias 60, such that the traces 450B electrically connect the contacts 450A with the vias 60. The vias 60 may be electrically connected with the vias 17B through the traces 17A, from which the vias 60 and 17B may extend. The conductive portions 470, thus, may be electrically connected with the contacts 450A, which are joined to the contacts on the chip 502 by the masses 506, by a conductive structure including the conductive vias 60 and 17B and the traces 17A. The conductive portions 470, which are electrically connected with the vias 17B, serve as terminals that may provide for electrical connection of the vias 60, through the traces 17B and the vias 17B, with contacts (not shown) of an external microelectronic element 570, through the solder masses 474 formed on the outer surfaces 472 of the portions 470.

In one embodiment, referring to FIG. 8, a dielectric element 480 in the substrate 412 may include the compliant dielectric layer 18 adjacent the chip 502 in combination with the rigid layer 16. In addition, a conductive structure electrically connecting terminals with substrate contacts may include conductive traces, such as the traces 450B, extending along and parallel to a front surface 481A of the dielectric element 480, such as the surface 20 of the compliant layer 18; conductive portions, such as the contacts 470, extending along and parallel to a bottom surface 481B of the dielectric element 480, such as the surface 416 of the rigid layer 16; and conductive traces between the surfaces 481A and 481B and, in one example, extending along a boundary between the layers 16 and 18, such as the traces 17A between the layers 16 and 18.

In one embodiment, a microelectronic package may be formed by using the terminals 470 to bond the assembly 400 to corresponding contacts of the external microelectronic element 570, which may be a circuit panel included in electronic devices such as a smart phone, mobile phone, personal digital assistant (PDA) and the like, with bonding material, such as solder, between the terminals and the circuit panel that joins the assembly 400 with the circuit panel. In a further embodiment, the bonding material may be the solder masses 474 of the assembly 400. Alternatively, the solder masses 474 may be omitted from the assembly 400, and bonding material, such as solder, may be applied at the terminals 470 when the assembly 400 is joined to the external microelectronic element 570.

In a further embodiment, the dielectric element 480 may include a compliant dielectric sub-element adjacent to the top surface of the substrate, where the compliant dielectric sub-element is formed from a plurality of adjacent layers of compliant dielectric material with conductive traces in between the adjacent layers, and has conductive vias extending through a thickness of the compliant dielectric layers, such as disclosed in U.S. application Ser. No. 13/105,325 filed May 11, 2011 incorporated by reference herein.

In some embodiments, the dielectric element 480 may include a rigid dielectric sub-element between the compliant dielectric layer adjacent to the top surface of the substrate and the rear surface of the substrate, where the rigid dielectric sub-element is formed from a plurality of adjacent layers of rigid dielectric material with conductive traces in between the adjacent layers, and has conductive vias extending through a thickness of the rigid dielectric layers.

Still referring to FIG. 8, the assembly 400 further may include a rigid underfill 510 between the surface 504 of the chip 502 and the top surface 20 of the compliant layer 18 facing the chip. The rigid underfill 510 may be formed adhered to portions of the surface 20, exposed portions of the conductive portions 450 and exposed portions of the optional protective layer 468. In one embodiment, the rigid underfill 510 may overlie portions of the surface 20 of the compliant dielectric layer 18 adjacent to the chip 502. The rigid underfill 510 may have a Young's modulus of about 6 GPa or greater and include dielectric material.

In a further embodiment, a layer of encapsulant 514 may be provided covering portions of the substrate, and portions of the chip and the underfill, to protect the encapsulated components from the external environment. The encapsulant 514 may include dielectric material, and may or may not be molded, such as shown in FIG. 8.

In another embodiment, underfill and a layer of encapsulant may be made of the same material, such as a dielectric material, and applied at the same time, such as part of a molding process.

In accordance with an embodiment, the structural and material characteristics of the substrate contacts, the terminals and a dielectric element, which includes a compliant dielectric layer adjacent the substrate contacts and a rigid layer as exemplified in the assembly 400, may be adapted to permit displacement of the substrate contacts relative to the terminals of the substrate, and provide that the displacement appreciably relieves mechanical stresses, such as may be caused by differential thermal expansion or contraction, which would be present in electrical connections between the substrate contacts and a microelectronic element connected with the terminals absent such displacement. In particular, the structural and material characteristics of the substrate contacts, the dielectric element and the terminals may be adapted to permit more movement of the substrate contacts relative to the terminals, in comparison to the amount of relative movement that would be permitted absent the combination of the dielectric element between the substrate contacts and the terminals, the substrate contacts and the terminals adapted in accordance with the present invention. In this way, the movability of the substrate contacts under applied loads may appreciably reduce mechanical stresses in the electrical connections between the substrate contacts and the contacts of the chip attached thereto.

Referring to FIG. 8, in the assembly 400, the contacts 450A desirably can move or tilt slightly with respect to the solder masses 472, which may be bonded to the conductive regions 470 that serve as terminals of the substrate 412, and the conductive regions 470 serving as the terminals, based on the compliancy of the dielectric element 480 between the conductive regions 450 and the conductive regions 470. The dielectric element 480 can flex or otherwise deform to accommodate movement of the contacts 450A bonded to the chip relative to the terminals 470, when the terminals 470 are attached to an external component, as may be caused, for example, by differential thermal expansion and contraction of the elements during operation, during manufacture as, for example, during a solder bonding process, or during testing.

In one embodiment, a solder resist layer 490 may overlie portions of the surface 416 of the rigid layer 16 except for locations at which the terminals 470 are formed.

In another embodiment, the terminals 470 may be adapted to simultaneously carry different electrical signals or electrical potentials, and be bonded to an external component 570 similarly as in FIG. 8.

In an alternative embodiment, the substrate 412 of FIG. 8 may be joined to a plurality of microelectronic elements 502 by masses of a conductive material such as a bond metal, e.g., solder, tin or indium, or a conductive paste 506, which electrically interconnects and bonds contacts (not shown) of the elements 502 with the pads 450A. The underfill 110 may be applied between each of the elements 502 and the substrate, followed by application of the encapsulant. The substrate 412 covered by the encapsulant may then be severed to obtain discrete microelectronic assemblies 400 each containing a microelectronic element 502, and the conductive layer 469 may be etched to form conductive portions 470, which serve as terminals, or alternatively pads, of each of the discrete microelectronic assemblies 400.

In a further embodiment (FIG. 9), a microelectronic assembly 500 has features similar to that shown in FIG. 8, except that the conductive portions 470 are shaped in the form of posts, the posts serving as terminals of the substrate to which an external chip may be connected. In one embodiment, the terminals 470 may have a thickness of about 50-300 µm. In the particular embodiment depicted, the terminals 470 have horizontal dimensions (in directions parallel to surfaces of the dielectric element 480) at a surface adjacent the rigid layer 16 greater than the horizontal dimensions at a surface remote from the layer 16, such that the horizontal dimensions of the terminal 470 decrease in the direction away from the layer 16 so as to be in the form of a post, which desirably is a substantially rigid solid metal post. In such embodiment, some of the conductive portions 470 may be aligned with the conductive vias 17B, which electrically connect the conductive portions 470 that serve as the terminals of the substrate with the conductive portions 450, through the traces 17A and the conductive vias 60.

In some embodiments, one or more solder masses 474 may be formed on the exposed surfaces of the terminals 470 of the assembly 500.

Figure 10:
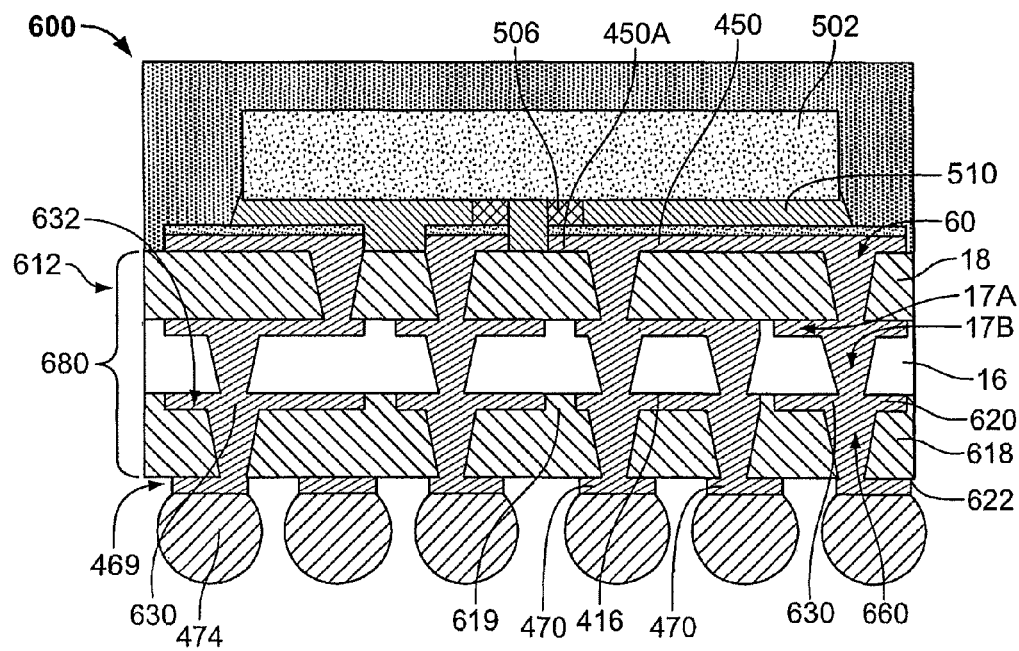
FIG. 10 is a fragmentary sectional view of a microelectronic assembly, in accordance with another embodiment of the invention.

In a further embodiment, referring to FIG. 10, a microelectronic assembly 600 may include the chip 502 electrically connected with a substrate 612, which is fabricated and has features similar to the substrate of the assembly 400 of FIG. 8. In this case, the substrate 612 can be similar to the substrate 412, except that the structure of a dielectric element 680 includes the compliant dielectric layer 18 adjacent the substrate contacts, the rigid layer 16 and an additional compliant dielectric layer 618 having top and bottom surfaces 620, 622, where the layer 16 is between the layers 18 and 618. The compliant dielectric layer 618 may desirably have a Young's modulus of less than about 2 GPa, and the rigid layer 16 may have a Young's modulus at least 50% greater than the Young's modulus of the layer 618. In this embodiment, additional conductive traces 630 may be disposed between the top surface 620 of the compliant layer 618 and the bottom surface 416 of the rigid layer 16 and extend in a lateral direction parallel to the surfaces 620 and 416. Further, additional conductive vias 660 may extend through holes in the compliant layer 618 and electrically connect the traces 630 with the terminals 470. The traces 630 may electrically connect the vias 17B with the vias 660, such that the terminals 470 are electrically connected with the contacts 450A through a conductive structure including the vias 660, the traces 630, the vias 17B, the traces 17A and the vias 60. In this embodiment, fabrication may be performed to laminate conductive layer 632, from which the traces 630 are formed, to the surface 416 of the rigid layer 16 or the top surface 620 of the compliant layer 618, so that projections 619 of dielectric material of the dielectric material of the layer 618 extend from the surface 620 upwardly through openings between the conductive portions 630 of the layer 632. In addition, in this embodiment, a conductive layer 469 from which the conductive portions 470 are formed may be laminated to the bottom surface 622 of the layer 618 during fabrication. Further, the layer 618 may be patterned with holes that contain the vias 660 in a pattern corresponding to the holes of the rigid layer 16, such that the vias 660 and 17B are vertically aligned and the vias 660 and 17B extend from the traces 630. Thus, in this embodiment the terminals 470 are electrically connected with the contacts 450 through the vias 660, the traces 630, the vias 17B, the traces 17A and the vias 60, such that the terminals 470 may bend slightly due to the compliancy of the dielectric element 680, to accommodate movement relative to the contacts 450A connected to the chip 502 that may be caused by differential thermal expansion and contraction.

Figure 9:
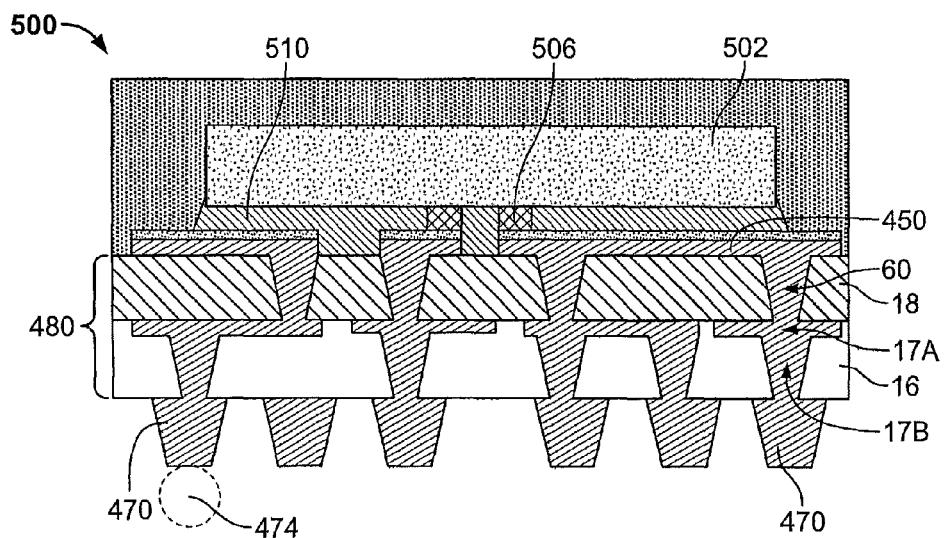
FIG. 9 is a fragmentary sectional view of a microelectronic assembly, in accordance with another embodiment of the invention.

In a further embodiment (FIG. 11), a microelectronic assembly 700 has features similar to that shown in FIG. 10, except that the terminals are conductive portions 470 at the surface 622 of the compliant layer 618 which are in the shape of posts, similarly as in the assembly shown in FIG. 9.

Figure 11:
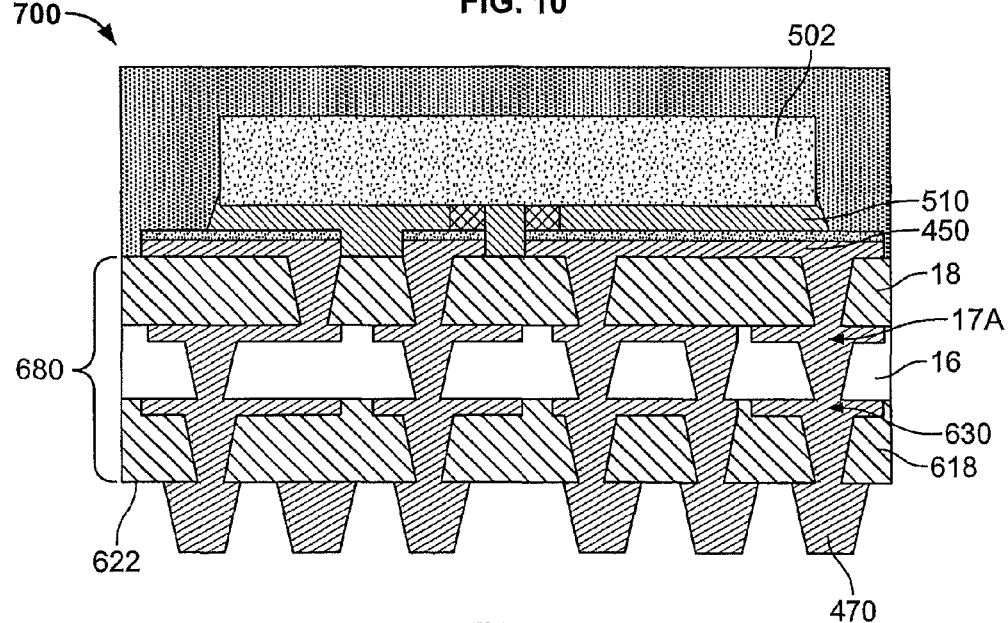
FIG. 11 is a fragmentary sectional view of a microelectronic assembly, in accordance with another embodiment of the invention.

In some embodiments, the assemblies of FIGS. 10-11 may include a solder resist layer overlying the surface 622 of the compliant layer 618, such as described above with reference to FIG. 8.

The microelectronic assemblies described above can be utilized in construction of diverse electronic systems, as shown in FIG. 12. For example, a system 800 in accordance with a further embodiment of the invention includes a microelectronic assembly 806 as described above in conjunction with other electronic components 808 and 810. In the example depicted, component 808 is a semiconductor chip whereas component 810 is a display screen, but any other components can be used. Of course, although only two additional components are depicted in FIG. 12 for clarity of illustration, the system may include any number of such components. The microelectronic assembly 806 may be any of the assemblies described above. In a further variant, any number of such microelectronic assemblies may be used. Microelectronic assembly 806 and components 808 and 810 are mounted in a common housing 811, schematically depicted in broken lines, and are electrically interconnected with one another as necessary to form the desired circuit. In the exemplary system shown, the system includes a circuit panel 812 such as a flexible printed circuit board, and the circuit panel includes numerous conductors 814, of which only one is depicted in FIG. 12, interconnecting the components with one another. However, this is merely exemplary; any suitable structure for making electrical connections can be used. The housing 811 is depicted as a portable housing of the type usable, for example, in a cellular telephone or personal digital assistant, and screen 810 is exposed at the surface of the housing. Where structure 806 includes a light sensitive element such as an imaging chip, a lens 816 or other optical device also may be provided for routing light to the structure. Again, the simplified system shown in FIG. 12 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. The following numbered paragraphs additionally describe embodiments of the invention as set forth herein.

The invention claimed is:

1. A method for forming a microelectronic assembly comprising:
providing a substrate including a first dielectric layer having a first composition having electrically conductive elements thereon, the first dielectric layer having a coefficient of thermal expansion of at least 10 parts per million/° C.;
forming a second dielectric layer overlying the first dielectric layer having a surface at which electrically conductive substrate contacts respectively overlying the conductive elements are exposed, the second dielectric layer having a Young's modulus of less than about 2 GPa;
electrically connecting the conductive elements respectively with the substrate contacts by conductive vias extending through the second dielectric layer, the vias being disposed entirely below the respective substrate contacts; and
joining the substrate contacts to respective contacts exposed at a face of a microelectronic element, the surface of the substrate confronting the face of the microelectronic element,
wherein the microelectronic element further includes a dielectric region, in which the dielectric region includes a dielectric material having a low-k dielectric constant, and wherein a stiffness of the substrate contacts is such that the substrate contacts have a capability to move that limits an amount of stress transferred by the substrate contacts to the dielectric region of the microelectronic element by said movement of the substrate contacts to below a level of stress that would be transferred to the dielectric region of the microelectronic element, such as caused by differential expansion or contraction absent said movement of the substrate contacts, in which the amount of stress is lower than a tolerance level of stress of the dielectric region.

2. The method of claim 1, wherein a ratio of a diameter of the conductive vias to a diameter of the respective substrate contacts is less than 40%.

3. The method of claim 1, wherein the vias extend through the second dielectric layer from substantially a center of a surface of the respective substrate contacts confronting the vias.

4. The method of claim 1, wherein the vias have a thickness extending in a direction perpendicular to the surface of the second dielectric layer of at least 20 microns.

5. The method of claim 4, wherein a ratio of a diameter of the substrate contacts to a diameter of the conductive vias is less than 40%.

6. The method of claim 1, wherein the first dielectric layer and the microelectronic element have a Young's modulus exceeding the Young's modulus of the second dielectric layer.

7. The method of claim 1, wherein the substrate contacts have a thickness extending in a direction perpendicular to the surface of the second dielectric layer of less than 20 microns.

8. The method of claim 1, wherein the substrate contacts, the vias and the second dielectric layer are adapted to permit displacement of the substrate contacts relative to the conductive elements, wherein the displacement appreciably relieves mechanical stresses, such as caused by differential thermal expansion or contraction which would be present in electrical connections between the substrate contacts and the microelectronic element absent such displacement.

9. The method of claim 1 further comprising:
joining the contacts of the substrate and the microelectronic elements through a bond metal including at least one of solder, tin or indium.

10. The method of claim 1, wherein the coefficient of thermal expansion of the first dielectric layer is greater than a coefficient of thermal expansion of the microelectronic element, such that the microelectronic element applies substantial loads to the substrate contacts due to a difference in the coefficients of thermal expansion between the first dielectric layer and the microelectronic element.

11. The method of claim 1, wherein the first dielectric layer and the microelectronic element have a Young's modulus exceeding the Young's modulus of the second dielectric layer, and wherein the coefficient of thermal expansion of the first dielectric layer is greater than a coefficient of thermal expansion of the microelectronic element.

* * * * *